(12) United States Patent
Yang et al.

(10) Patent No.: US 7,727,824 B2
(45) Date of Patent: Jun. 1, 2010

(54) LIQUID CRYSTAL DISPLAY DEVICE AND FABRICATING METHOD THEREOF

(75) Inventors: Joon Young Yang, Bucheon-si (KR); Jae Young Oh, Uiwang-si (KR); Soopool Kim, Seongnam-si (KR)

(73) Assignee: LG Display Co., Ltd., Seoul (KR)

( * ) Notice: Subject to any disclaimer, the term of this patent is extended or adjusted under 35 U.S.C. 154(b) by 477 days.

(21) Appl. No.: 11/591,584

(22) Filed: Nov. 2, 2006

(65) Prior Publication Data

US 2007/0257289 A1 Nov. 8, 2007

(30) Foreign Application Priority Data

May 3, 2006 (KR) ................. 10-2006-0040062

(51) Int. Cl.
*H01L 21/00* (2006.01)
(52) U.S. Cl. ............... 438/149; 438/30; 438/151; 257/72
(58) Field of Classification Search ............. 438/30, 438/39, 40, 149, 151; 257/59, 72, 257; 349/42, 349/43, 47
See application file for complete search history.

(56) References Cited

U.S. PATENT DOCUMENTS 6,107,173 A * 8/2000 Han ................. 438/585
6,284,637 B1 * 9/2001 Chhagan et al. ......... 438/594
2003/0183857 A1 10/2003 Korenari
2005/0127366 A1 * 6/2005 Jeong et al. ............ 257/72
2005/0156239 A1 * 7/2005 Seko et al. ............. 257/347

FOREIGN PATENT DOCUMENTS

JP 2000-31493 1/2000
JP 2002-343976 11/2002

OTHER PUBLICATIONS

Wolf et al., "Silicon Processing for the VLSI Era, vol. 1—Process Technology", Lattice Press, second edition, 2000, pp. 686-688.*

* cited by examiner

*Primary Examiner*—Ha Tran T Nguyen
*Assistant Examiner*—Daniel Whalen
(74) *Attorney, Agent, or Firm*—McKenna Long & Aldridge

(57) ABSTRACT

A liquid crystal display device may comprise a semiconductor layer on a substrate and including a channel portion and ohmic contact portions at both sides of the channel portion, wherein an edge portion of the semiconductor layer has a side surface of a substantially tapered shape; a gate insulating layer covering the semiconductor layer; a gate electrode on the gate insulating layer and substantially corresponding to the channel portion; source and drain electrodes contacting the semiconductor layer; and a pixel electrode contacting the drain electrode.

5 Claims, 16 Drawing Sheets first dry etching

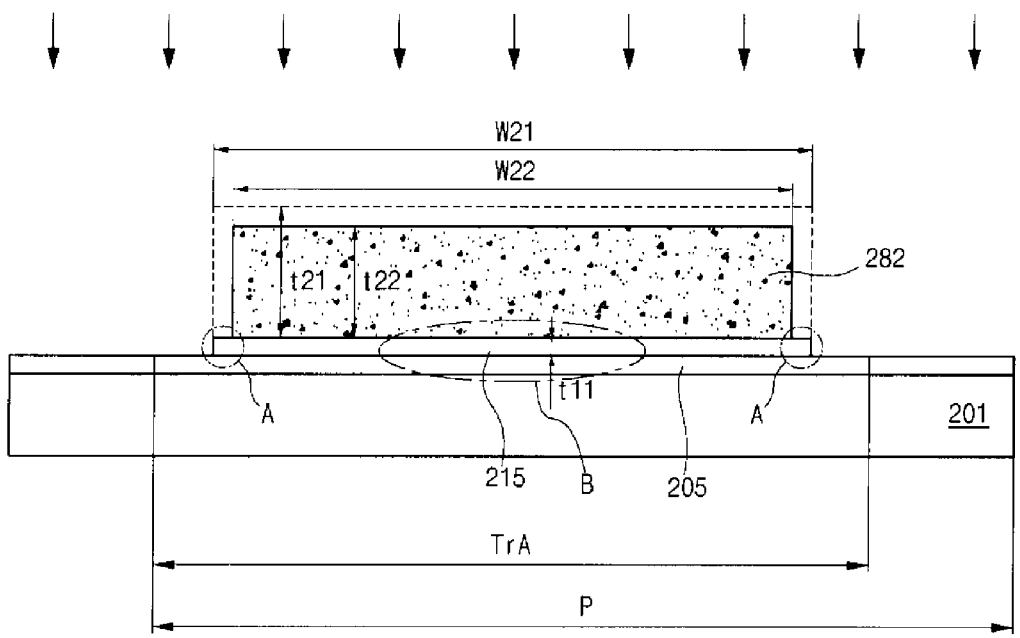

second dry etching dry etching

HBr, Cl₂, SF₆, Br₂ + O₂

LIQUID CRYSTAL DISPLAY DEVICE AND FABRICATING METHOD THEREOF

This application claims the benefit of Korean Patent Application No. 2006-040062 filed on May 3, 2006, which is hereby incorporated by reference for all purposes as if fully set forth herein.

BACKGROUND OF THE INVENTION

1. Field of the Invention

The present invention relates to a liquid crystal display device, and more particularly, to a liquid crystal display (LCD) device and a method of fabricating the LCD device.

2. Discussion of the Related Art

Flat panel display devices have begun to replace cathode-ray tubes (CRTs) for information display applications. Various types of flat panel displays, such as liquid crystal display (LCD) devices, plasma display panels (PDPs), field emission displays (FEDs), and electro-luminescence displays (ELDs) have been developed to replace CRTs. Of these types of flat panel displays, LCD devices have many advantages, such as high resolution, light weight, thin profile, compact size, and low voltage power supply requirements.

In general, an LCD device includes two substrates that are spaced apart and opposite each other with a liquid crystal material interposed between the two substrates. The two substrates include electrodes facing each other such that a voltage applied between the electrodes induces an electric field across the liquid crystal material. Alignment of the liquid crystal molecules in the liquid crystal material changes proportionally with the intensity of the induced electric field in the direction of the induced electric field, thereby changing the light transmissivity of the LCD device. Thus, the LCD device displays images by varying the intensity of the induced electric field.

Recently, active matrix type LCD devices, which include thin film transistors (TFTs) and pixel electrodes arranged in matrix form, have been typically used. Hydrogenated amorphous silicon (a-Si:H) has been used as an active layer for the TFT because of its low temperature applications and because it is inexpensive. However, because the atoms in the hydrogenated amorphous silicon are randomly arranged, the bonds between the silicon atoms are weak and dangling. Accordingly, when light is irradiated or an electric field is induced, the silicon atom is in a quasi-stable state, thereby making the TFT unstable. The weak bonds also result in poor electrical properties. For example, the field effect mobility value is as low as 0.1 to 1.0 $cm^2/V \cdot sec$. Therefore, TFTs having amorphous silicon cannot reliably be used as switching devices.

In contrast, poly-crystalline silicon can be used for a driving circuit since poly-crystalline silicon has higher field effect mobility than does amorphous silicon.

FIGS. 1 and 2 are cross-sectional views, taken along a length direction and a width direction of a channel portion, respectively, illustrating an LCD device having a thin film transistor using poly-crystalline silicon according to the related art.

As illustrated in FIGS. 1 and 2, a buffer layer 18 is formed on a substrate 15. A semiconductor layer 23 of poly-crystalline silicon is formed on the buffer layer 18 in a switching region TrA. The entire semiconductor layer 23 has the same thickness. The semiconductor layer 23 has a channel portion 23a of intrinsic poly-crystalline silicon at the center of the semiconductor layer 23, and has ohmic contact portions 23b of impurity-doped poly-crystalline silicon at both sides of the semiconductor layer 23. When the impurity is n+ions, the semiconductor layer 23 further has lightly doped drain (LDD) portions 23c, which have impurity concentrations lower than the ohmic contact portions 23b, between the ohmic contact layers 23b and the channel portion 23a.

A gate insulating layer 28 is formed on the substrate 15 having the semiconductor layer 23. A gate electrode 35 is formed on the gate insulating layer 28 and corresponds to the channel portion 23a.

An interlayer insulating film 43 is formed on the substrate 15 having the gate electrode 35. The interlayer insulating film 43 and the gate insulating layer 28 have semiconductor contact holes 45a and 45b exposing the ohmic contact portions 23b. Source and drain electrodes 48 and 53 are formed on the interlayer insulating film 43. The source and drain electrodes 48 and 53 contact the ohmic contact portions 23b through the semiconductor contact holes 45a and 45b.

A passivation layer 60 is formed on the substrate 15 having the source and drain electrodes 48 and 53. The passivation layer 60 has a drain contact hole 63. A pixel electrode 65 is formed on the passivation layer 60 in a pixel region P. The pixel electrode 65 contacts the drain electrode 53 through the drain contact hole 63.

As explained above, the entire portions of the semiconductor layer 23 all have the same thickness. A side surface of an edge portion A of the semiconductor layer 23 has an angle θ1 equal to or more than 80 degrees with respect to a plane of the substrate 15.

Due to the structure of the semiconductor layer 23, step coverage of the gate insulating layer 28 is degraded. A step portion of the gate insulating layer 28 near the edge portion A of the semiconductor layer 23 has a thickness t2 thinner than a thickness t1 of other portions of the gate insulating layer 28. Accordingly, referring to FIG. 2, a step portion of the gate electrode 35 near the edge portion A of the semiconductor layer 23 has a thickness t3 thinner than a thickness t4 of other portions of the gate electrode 35.

Since the step portions of the gate insulating layer 28 and the gate electrode 35, corresponding to the edge portion A of the semiconductor layer 23, has the thickness t2 and t3 thinner than the thickness t1 and t4 of other portions of the gate insulating layer 28 and the gate electrode 35, strong electric fields due to the fringe field effect are induced at the edge portion A and a strong side current is generated along a width of the channel portion 23a. The side current disturbs the normally flowing drain current.

FIG. 3 is a graph illustrating a transfer curve of a gate voltage to a drain current in the LCD device according to the related art. In FIG. 3, a width of an LDD portion is 1 µl, and width and length of a channel portion are 4 µm and 4 µm.

When a gate voltage is applied within a range of 0V to 3V, drain current should linearly increase in order for a thin film transistor to operate normally. However, referring to FIG. 3, the side current due to the fringe field effect disturbs the flowing drain current. Accordingly, a hump i.e., a non-linear portion of the transfer curve, results.

The hump causes on/off time delays of the thin film transistor, and thus reliability of the thin film transistor is degraded.

SUMMARY OF THE INVENTION

Accordingly, the present invention is directed to an LCD device and a method of fabricating the same that substantially obviate one or more problems due to limitations and disadvantages of the related art.

It is an advantage of the present invention to provide an LCD device and a method of fabricating the same in which thin film transistor reliability is improved.

Additional features and advantages of the present invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the invention, as embodied and broadly described herein, a liquid crystal display device comprises a semiconductor layer on a substrate and including a channel portion and ohmic contact portions at both sides of the channel portion, wherein an edge portion of the semiconductor layer has a side surface of a substantially tapered shape; a gate insulating layer covering the semiconductor layer; a gate electrode on the gate insulating layer and substantially corresponding to the channel portion; source and drain electrodes contacting the semiconductor layer; and a pixel electrode contacting the drain electrode.

In another aspect, a liquid crystal display device comprises a semiconductor layer on a substrate and including a channel portion and ohmic contact portions at both sides of the channel portion, wherein an edge portion of the semiconductor layer has at least two steps; a gate insulating layer covering the semiconductor layer; a gate electrode on the gate insulating layer and substantially corresponding to the channel portion; source and drain electrodes contacting the semiconductor layer; and a pixel electrode contacting the drain electrode.

In another aspect, a method of fabricating a liquid crystal display device comprises forming a semiconductor layer on a substrate and including a channel portion and ohmic contact portions at both sides of the channel portion, wherein an edge portion of the semiconductor layer has a side surface of a substantially tapered shape; forming a gate insulating layer covering the semiconductor layer; forming a gate electrode on the gate insulating layer and substantially corresponding to the channel portion; forming source and drain electrodes contacting the semiconductor layer; and forming a pixel electrode contacting the drain electrode.

In another aspect, a method of fabricating a liquid crystal display device comprises forming a semiconductor layer on a substrate and including a channel portion and ohmic contact portions at both sides of the channel portion, wherein an edge portion of the semiconductor layer has at least two steps; forming a gate insulating layer covering the semiconductor layer; forming a gate electrode on the gate insulating layer and substantially corresponding to the channel portion; forming source and drain electrodes contacting the semiconductor layer; and forming a pixel electrode contacting the drain electrode.

In another aspect, a liquid crystal display device comprises a semiconductor layer on a substrate and including a channel portion and ohmic contact portions at both sides of the channel portion, wherein an edge portion of the semiconductor layer has a thickness gradually reduced outwardly; a gate insulating layer covering the semiconductor layer; a gate electrode on the gate insulating layer and substantially corresponding to the channel portion; source and drain electrodes contacting the semiconductor layer; and a pixel electrode contacting the drain electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings.

Figure 4:
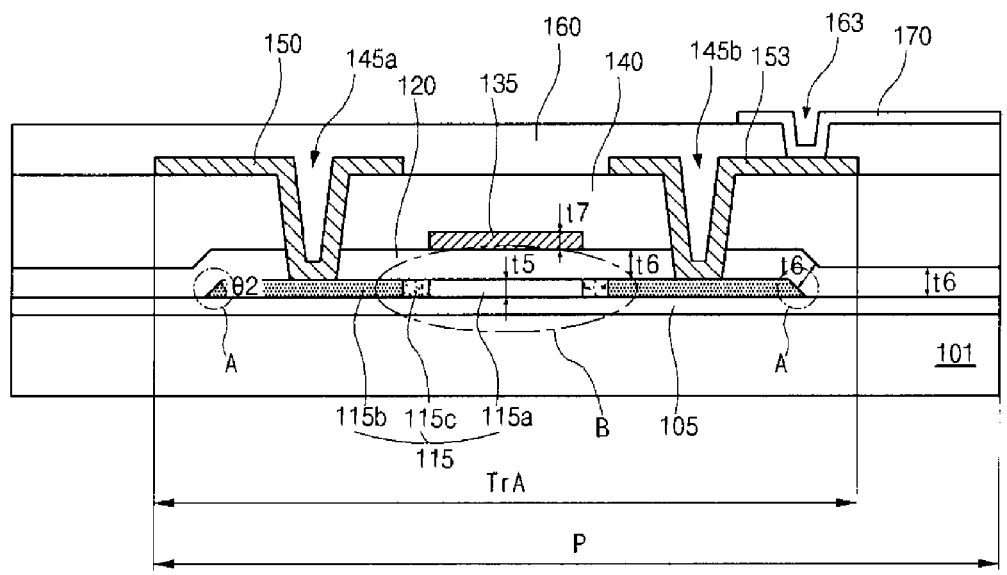
FIGS. 4 and 5 are cross-sectional views, taken along a length direction and a width direction of a channel portion, respectively, illustrating an LCD device having a thin film transistor using poly-crystalline silicon according to a first embodiment of the present invention.
Figure 5:
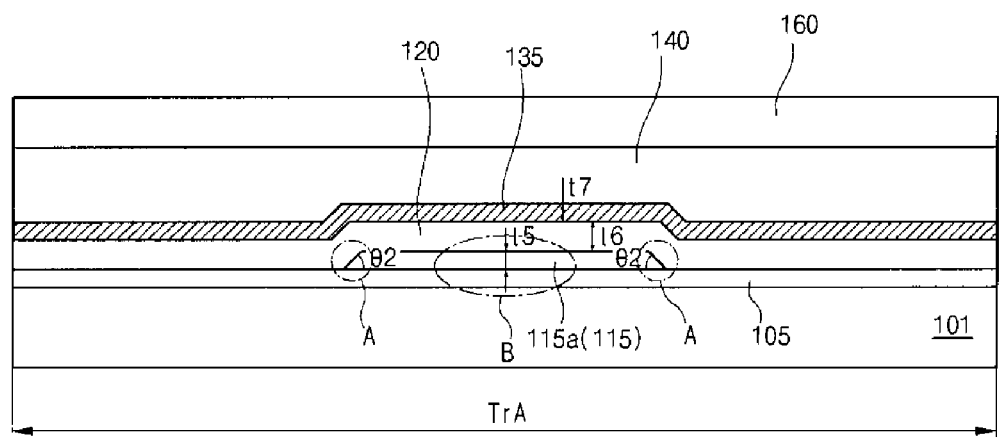

FIGS. 4 and 5 are cross-sectional views, taken along a length direction and a width direction of a channel portion, respectively, illustrating an LCD device having a thin film transistor using poly-crystalline silicon according to a first embodiment of the present invention. The length direction of the channel portion is a direction from a source electrode to a drain electrode, and the width direction of the channel portion is an extended direction of a gate electrode perpendicular to the length direction of the channel portion.

As illustrated in FIGS. 4 and 5, a buffer layer 105 is formed on a substrate 101. A semiconductor layer 115 of poly-crystalline silicon is formed on the buffer layer 105 in a switching region TrA.

Portions of the semiconductor layer 115 except for an edge portion A have substantially the same thickness t5. The edge portion A has a substantially taper shape such that a thickness of the edge portion A may be gently reduced outwardly. A side surface of the edge portion A may have an angle θ2 of about 30 to about 60 degrees with respect to a plane of the substrate 101.

The semiconductor layer 115 has the channel portion 115a of intrinsic poly-crystalline silicon at the center of the semiconductor layer 115, and has ohmic contact portions 115b of impurity-doped poly-crystalline silicon at both sides of the semiconductor layer 115. When the impurity is n+ ions, the semiconductor layer 115 further has lightly doped drain (LDD) portions 115c substantially between the ohmic contact portions 115b and the channel portion 115a. Further, when the impurity is n+ ions, the lightly doped drain (LDD) portions may have impurity concentrations substantially lower than the ohmic contact portions 115b. When the impurity is p+ ions, the lightly doped drain (LDD) portion 115c may not be formed.

A gate insulating layer 120 is formed on the substrate 101 having the semiconductor layer 115. A gate electrode 135 is formed on the gate insulating layer 120 and substantially corresponds to the channel portion 115a. The gate electrode 135 fully covers the channel portion 115a along the width direction, and substantially corresponds with the channel portion 115a along the length direction. The gate insulating layer 120 may be formed directly below the gate electrode 135.

Due to the substantially tapered shape of the edge portion A with the angle θ2 of about 30 to about 60 degrees, step coverage of the gate insulating layer 120 and the gate electrode 135 over the semiconductor layer 115 are improved. A step portion of the gate insulating layer 120 near the edge portion A has substantially the same thickness t6 as other portions of the gate insulating layer 120. A step portion of the gate electrode 135 near the edge portion A has substantially the same thickness t7 as other portions of the gate electrode 135.

An interlayer insulating film 140 is formed on the substrate 101 having the gate electrode 135. The interlayer insulating film 140 and the gate insulating layer 120 have semiconductor contact holes 145a and 145b substantially exposing the ohmic contact portions 115b.

Source and drain electrodes 150 and 153 are formed on the interlayer insulating film 140. The source and drain electrodes 150 and 153 contact the ohmic contact portions 115b through the semiconductor contact holes 145a and 145b.

The semiconductor layer 115, the gate electrode 135, and the source and drain electrodes 150 and 153 defines a thin film transistor as a switching device.

A passivation layer 160 is formed on the substrate 101 having the source and drain electrodes 150 and 153. The passivation layer 160 has a drain contact hole 163. A pixel electrode 170 is formed on the passivation layer 160 in a pixel region P. The pixel electrode 170 contacts the drain electrode 153 through the drain contact hole 163.

Although not shown in the drawings, a gate line is formed along with the gate electrode 135, and a data line is formed along with the source and drain electrodes 150 and 153. The gate line and the data line cross each other to define the pixel region P.

In the first embodiment, due to the substantially tapered shape of the edge portion with the angle θ2 of about 30 to about 60 degrees, the step portions of the gate insulating layer 120 and the gate electrode 135 near the edge portion have substantially the same thickness as other portions. As a result, fringe effect may be reduced and a strong electric field induced due to the fringe effect may also be reduced at the edge portion. Accordingly, a side current along the width of the channel portion may be prevented. Further, although a strong electric field may be induced at the edge portion, since the edge portion has the thickness substantially less than other portions of the semiconductor layer, carriers such as electrons and holes may be reduced at the edge portion, and thus a side current may be prevented. Therefore, drain current flows normally with disruptions caused by a side current reduced, and a hump may be prevented. Thus, reliability of the thin film transistor can be achieved.

Figure 6:
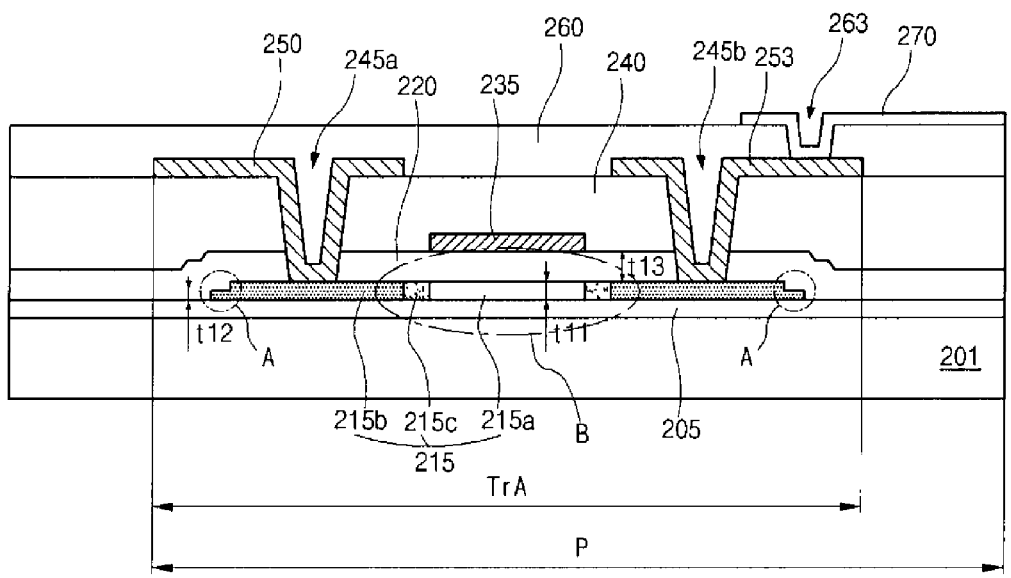
FIGS. 6 and 7 are cross-sectional views, taken along a length direction and a width direction of a channel portion, respectively, illustrating an LCD device having a thin film transistor using poly-crystalline silicon according to a second embodiment of the present invention.
Figure 7:
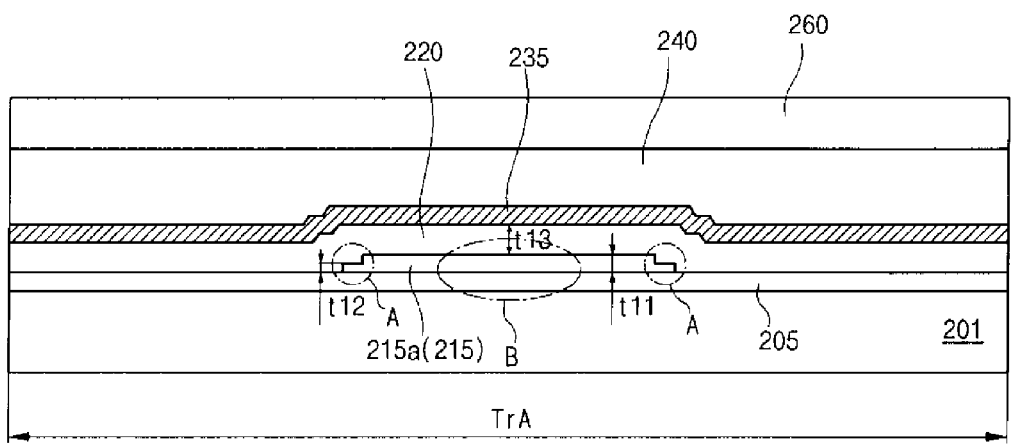

FIGS. 6 and 7 are cross-sectional views, taken along a length direction and a width direction of a channel portion, respectively, illustrating an LCD device having a thin film transistor using poly-crystalline silicon according to a second embodiment of the present invention. The LCD device of the second embodiment is similar to that of the first embodiment, except for a shape of an edge portion of a semiconductor layer. Detailed explanations of parts similar to those of the first embodiment are omitted.

As illustrated in FIGS. 6 and 7, a buffer layer 205 is formed on a substrate 201. A semiconductor layer 215 of poly-crystalline silicon is formed on the buffer layer 205 in a switching region TrA.

Portions of the semiconductor layer 215 except for an edge portion A have substantially the same thickness t11. The edge portion A has a multi-step shape such that a thickness of the edge portion A may be reduced outwardly. The edge portion A has at least two steps, for example. The thickness t12 of the lower step may be about half of the thickness t11 of the portions of the semiconductor layer 215 except for the edge portion A. The thickness of the higher step may be about half of the thickness t11 of the portions of the semiconductor layer 215 except for the edge portion A. Alternately, the thickness t12 of the lower step may be different from the thickness of the higher step.

The semiconductor layer 215 has the channel portion 215a of intrinsic poly-crystalline silicon at the center of the semiconductor layer 215, and has ohmic contact portions 215b of impurity-doped poly-crystalline silicon at both sides of the semiconductor layer 215. When the impurity is n+ ions, the semiconductor layer 215 further has lightly doped drain (LDD) portions 215c, substantially between the ohmic contact portions 215b and the channel portion 215a. Further, when the impurity is n+ ions, the lightly doped drain (LDD) portions may have impurity concentrations lower than the ohmic contact portions. When the impurity is p+ ions, the lightly doped drain (LDD) portion 215c may not be formed.

A gate insulating layer 220 is formed on the substrate 201 having the semiconductor layer 215. A gate electrode 235 is formed on the gate insulating layer 220 and substantially corresponds to the channel portion 215a. The gate insulating layer 220 may be formed directly below the gate electrode 235.

Due to the multi-step shape of the edge portion A, step coverage of the gate insulating layer 220 and the gate electrode 235 over the semiconductor layer 215 may be improved. A step portion of the gate insulating layer 220 near the edge portion A has substantially the same thickness t13 as other portions of the gate insulating layer 220. A step portion of the gate electrode 235 near the edge portion A has substantially the same thickness as other portions of the gate electrode 235.

An interlayer insulating film 240 is formed on the substrate 201 having the gate electrode 235. The interlayer insulating film 240 and the gate insulating layer 220 have semiconductor contact holes 245a and 245b substantially exposing the ohmic contact portions 215b.

Source and drain electrodes 250 and 253 are formed on the interlayer insulating film 240. The source and drain electrodes 250 and 253 contact the ohmic contact portions 215b through the semiconductor contact holes 245a and 245b.

The semiconductor layer 215, the gate electrode 235, and the source and drain electrodes 250 and 253 define a thin film transistor as a switching device.

A passivation layer 260 is formed on the substrate 201 having the source and drain electrodes 250 and 253. The passivation layer 260 has a drain contact hole 263. A pixel electrode 270 is formed on the passivation layer 260 in a pixel region P. The pixel electrode 270 contacts the drain electrode 253 through the drain contact hole 263.

Although not shown in the drawings, a gate line is formed along with the gate electrode 235, and a data line is formed along with the source and drain electrodes 250 and 253. The gate line and the data line cross each other to define the pixel region P.

In the second embodiment, due to the multi-step shape of the edge portion, the step portions of the gate insulating layer 220 and the gate electrode 235 near the edge portion have substantially the same thickness as other portions. Fringe effect may be reduced and a strong electric field induced due to fringe effect may also be reduced at the edge portion. Accordingly, a side current along the width of the channel portion may be prevented. Further, although a strong electric field may be induced at the edge portion, since the edge portion has the thickness substantially less than other portions of the semiconductor layer, carriers such as electrons and holes may be reduced at the edge portion, and thus the side current may be prevented. Therefore, drain current flows normally with disruptions from a side current reduced and a hump may be prevented. Thus, reliability of the thin film transistor can be achieved.

Figure 8:
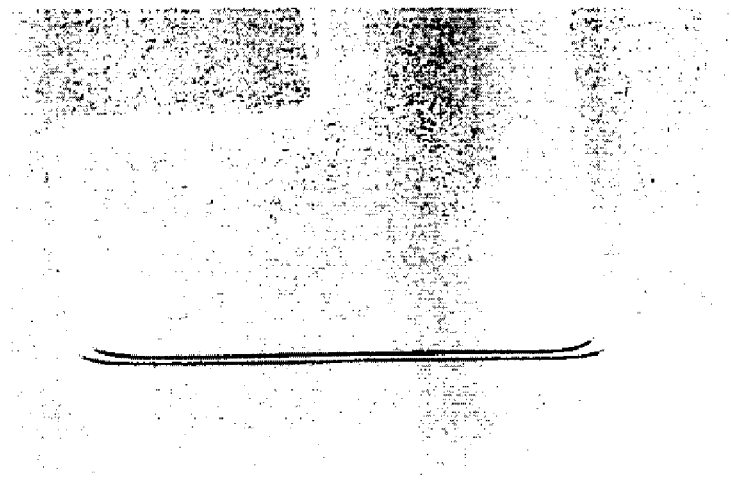
FIG. 8 is a SEM (scanning electron microscope) picture illustrating a semiconductor layer according to the second embodiment of the present invention.
Figure 9:
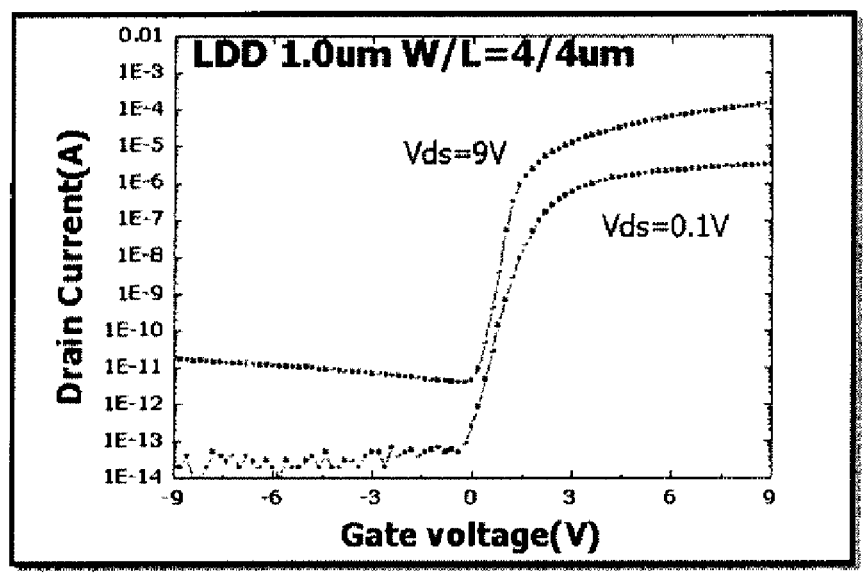
FIG. 9 is a graph illustrating a transfer curve of a gate voltage to a drain current in the LCD device according to the second embodiment of the present invention.

FIG. 8 is a SEM (scanning electron microscope) picture illustrating a semiconductor layer according to the second embodiment of the present invention, and FIG. 9 is a graph illustrating a transfer curve of a gate voltage to a drain current in the LCD device according to the second embodiment of the present invention. In FIG. 9, a width of a LDD portion is 1 μm, and width and length of a channel portion are each 4 μm and 4 μm.

When a gate voltage is applied within a range of 0V to 2V, drain current increases linearly and the thin film transistor operates normally. Accordingly, a hump i.e., a non-linear portion of the transfer curve, may be prevented. On/off time delays of the thin film transistor are prevented, and thus reliability of the thin film transistor can be achieved.

Figure 1:
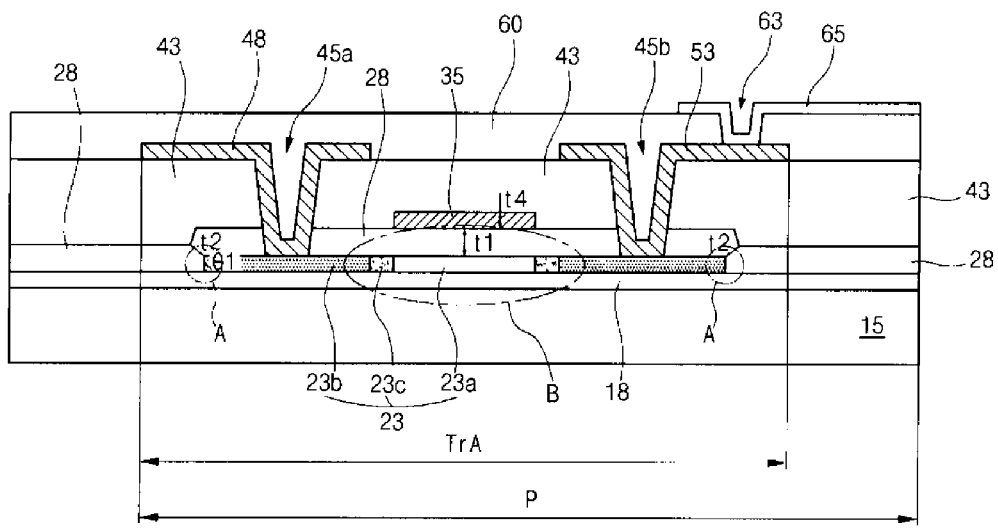
FIGS. 1 and 2 are cross-sectional views, taken along a length direction and a width direction of a channel portion, respectively, illustrating an LCD device having a thin film transistor using poly-crystalline silicon according to the related art.
Figure 2:
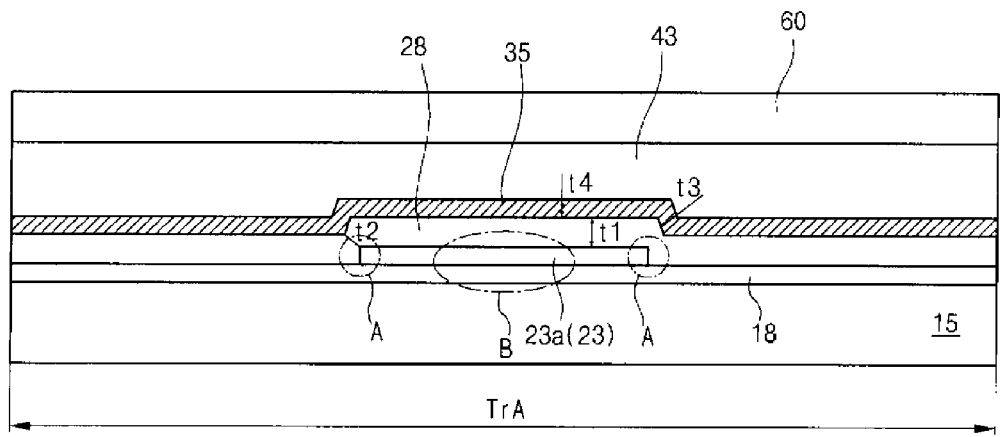
Figure 3:
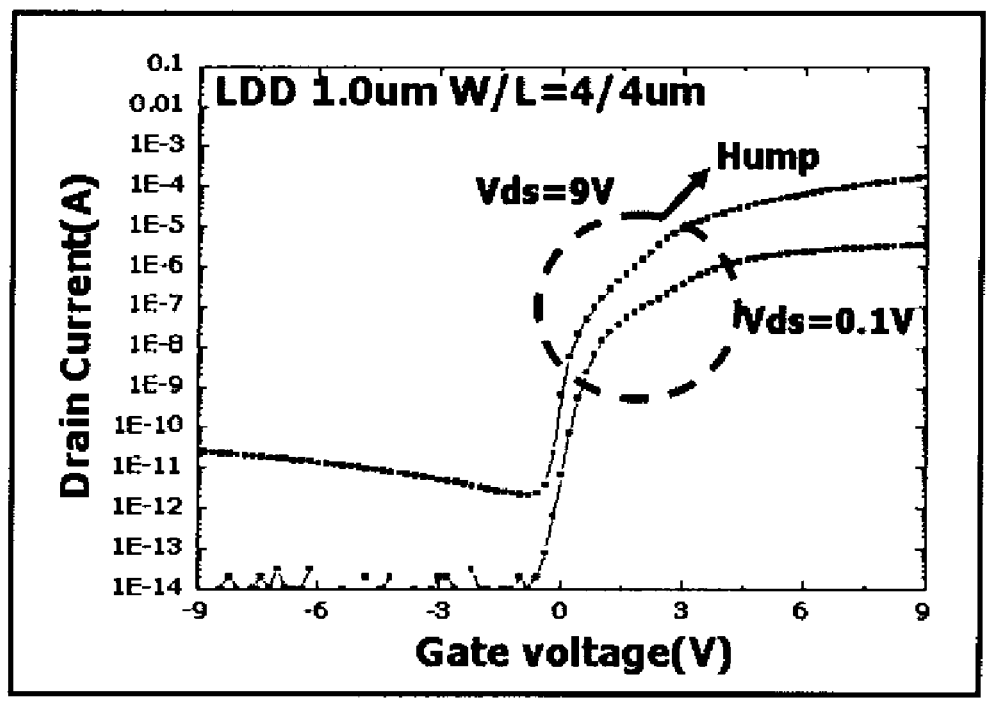
FIG. 3 is a graph illustrating a transfer curve of a gate voltage to a drain current in the LCD device according to the related art.

When comparing graphs of FIG. 9 and FIG. 3 at Vds=9V, a hump is caused in a gate voltage range of 0V to 3V in related art FIG. 3, whereas hump is hardly caused in a gate voltage range of 0V to 2V in FIG. 9.

Figure 10:
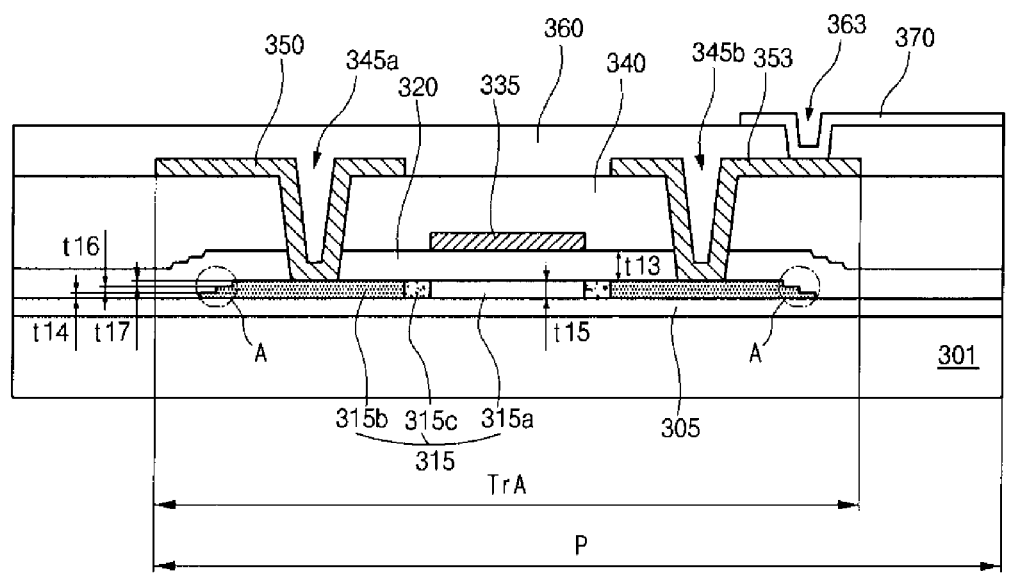
FIG. 10 is a cross-sectional view, taken along a length direction of a channel portion, illustrating an LCD device having a thin film transistor using poly-crystalline silicon according to a third embodiment of the present invention.

FIG. 10 is a cross-sectional view, taken along a length direction of a channel portion, illustrating an LCD device having a thin film transistor using poly-crystalline silicon according to a third embodiment of the present invention. The LCD device of the third embodiment is similar to that of the second embodiment. Detailed explanations of parts similar to those of the second embodiment are omitted.

An edge portion A of the third embodiment may have at least three steps. A lower step, a middle step and a higher step have thickness t14, t16 and t17. The thickness t14 of the lower step may be about a third of the thickness t15 of the portions of a semiconductor layer 315 except for the edge portion A. The thickness t16 of the middle step may be about a third of the thickness t15 of the portions of the semiconductor layer 315 except for the edge portion A. The thickness t17 of the higher step may be about a third of the thickness t15 of the portions of the semiconductor layer 315 except for the edge portion A. Alternately, the thickness t14, t16 and t17 of the lower, middle and higher steps may be different from one another. As a number of steps of the edge portion A increases, the thickness of the steps reduce, and thus a thickness of a gate insulating layer 320 becomes more uniform.

A buffer layer 305 is formed on a substrate 301. The semiconductor layer 315 of poly-crystalline silicon is formed on the buffer layer 305 in a switching region TrA.

The semiconductor layer 315 has a channel portion 315a of intrinsic poly-crystalline silicon at the center of the semiconductor layer 315, and has ohmic contact portions 315b of impurity-doped poly-crystalline silicon at both sides of the semiconductor layer 315. When the impurity is n+ ions, the semiconductor layer 315 further has lightly doped drain (LDD) portions 315c, which have an impurity concentration lower than the ohmic contact portion 315b, between the ohmic contact portions 315b and the channel portion 315a. When the impurity is p+ ions, the lightly doped drain (LDD) portion 315c may not be formed.

A gate electrode 335 is formed on the gate insulating layer 320 and substantially corresponds to the channel portion 315a. The gate insulating layer 320 may be formed directly below the gate electrode 335.

Due to the multi-step shape of the edge portion A, step coverage of the gate insulating layer 320 and the gate electrode 335 over the semiconductor layer 315 may be improved. A step portion of the gate insulating layer 320 near the edge portion A has substantially the same thickness t13 as other portions of the gate insulating layer 320. A step portion of the gate electrode 335 near the edge portion A has substantially the same thickness as other portions of the gate electrode 335.

An interlayer insulating film 340 is formed on the substrate 301 having the gate electrode 335. The interlayer insulating film 340 and the gate insulating layer 320 have semiconductor contact holes 345a and 345b exposing the ohmic contact portions 315b.

Source and drain electrodes 350 and 353 are formed on the interlayer insulating film 340. The source and drain electrodes 350 and 353 contact the ohmic contact portions 315b through the semiconductor contact holes 345a and 345b.

The semiconductor layer 315, the gate electrode 335, and the source and drain electrodes 350 and 353 define a thin film transistor as a switching device.

A passivation layer 360 is formed on the substrate 301 having the source and drain electrodes 350 and 353. The passivation layer 360 has a drain contact hole 363. A pixel electrode 370 is formed on the passivation layer 360 in a pixel region P. The pixel electrode 370 contacts the drain electrode 353 through the drain contact hole 363.

Although not shown in the drawings, a gate line is formed along with the gate electrode 335, and a data line is formed along with the source and drain electrodes 350 and 353. The gate line and the data line cross each other to define the pixel region P.

In the third embodiment, due to the multi-step shape of the edge portion, the step portions of the gate insulating layer and the gate electrode near the edge portion have substantially the same thickness as other portions. Fringe effect may be reduced and a strong electric field induced due to the fringe effect may also be reduced at the edge portion. Accordingly, a side current along the width of the channel portion may be prevented. Further, although a strong electric field may be induced at the edge portion, since the edge portion has the thickness substantially less than other portions of the semiconductor layer, carriers such as electrons and holes may be reduced at the edge portion, and thus a side current may be prevented. Therefore, drain current flows normally with disruptions of a side current reduced, and a hump may be prevented. Thus, reliability of the thin film transistor can be achieved.

Methods of fabricating the LCD devices according to embodiments of the present invention are explained with reference to FIGS. 11A through 11L and 12A through 12C. The methods of fabricating the LCD devices of the first to third embodiments are similar, except for the formation of a semiconductor layer. Accordingly, those processes of forming elements other than the semiconductor layer formation process are explained commonly with reference to FIGS. 11A through 11L, and processes of forming the semiconductor layer are explained separately.

FIGS. 11A through 11L are cross-sectional views illustrating a method of fabricating the LCD device according to the second embodiment.

Figure 11A:
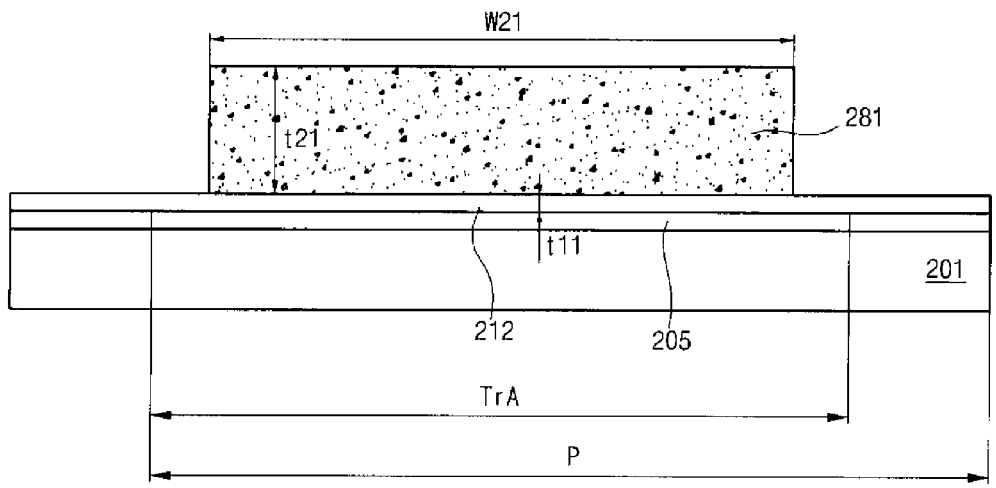
FIGS. 11A through and including 11L are cross-sectional views illustrating a method of fabricating the LCD device according to the second embodiment.

As illustrated in FIG. 11A, a buffer layer 205 is formed on a substrate 201 by depositing an inorganic material including silicon oxide ($SiO_2$) and silicon nitride (SiNx).

Amorphous silicon is deposited on the buffer layer 205 and a crystallization process is performed to form a poly-crystalline silicon layer 212. The crystallization process may be performed with an ELA (excimer laser annealing) method, a SLS (sequential lateral solidification) method, a thermal treatment method, or a MILC (metal induced lateral crystallization) method, for example. The poly-crystalline silicon layer 212 has a thickness t11, for example, about 500 to about 1000 angstroms.

A photoresist is coated on the poly-crystalline silicon layer 212. An exposure process using a mask and a developing process are performed for the photoresist to form a photoresist pattern 281 in a switching region TrA of a pixel region P. The photoresist pattern 281 has a thickness t21 and a width w21.

Figure 11B:
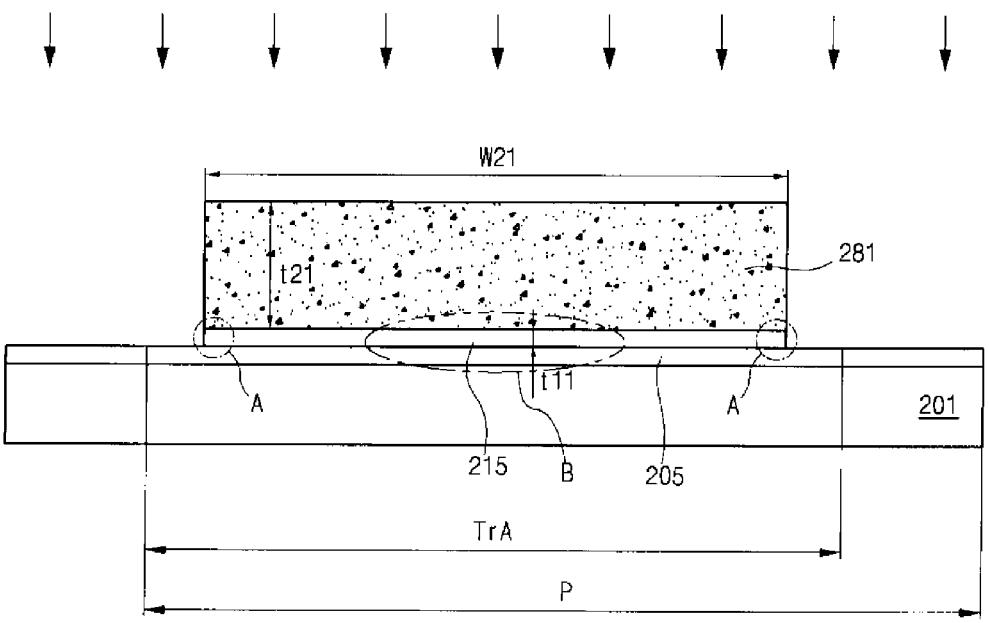

As illustrated in FIG. 11B, the poly-crystalline silicon layer (212 of FIG. 11A) is first-dry-etched using the photoresist pattern 281 as an etching mask to form a semiconductor layer 215. The semiconductor layer 215 has substantially the same width as the photoresist pattern 281. When first-dry-etching the poly-crystalline silicon layer, a dry-etching gas including at least two of hydrogen bromide (HBr) gas, chlorine ($Cl_2$) gas, sulfur hexafluoride ($SF_6$) gas and bromine ($Br_2$) gas is filled in a vacuum chamber and a plasma treatment is performed. The dry-etching gas is reacted with the poly-crystalline silicon layer and is not reacted with the photoresist pattern 281. Accordingly, a shape of the photoresist pattern 281 is not changed by the first-dry-etching. The first-dry-etching may have anisotropy.

As illustrated in FIG. 11C, an ashing process is performed for the substrate 201 in the chamber, which is used for the first-dry-etching, with replacing the dry-etching gas by oxygen ($O_2$) gas as an ashing gas. By the ashing process, the thickness t21 and the width w21 of the photoresist pattern (281 of FIG. 11B) is reduced and an ashed photoresist pattern 282 having a thickness t22 and a width w22 is formed. The ashing is isotropic, and side and upper portions the photoresist pattern are removed. The removed amount may be adjusted by keeping the oxygen ($O_2$) gas concentration constant and adjusting the ashing time. Through the ashing process, an edge portion A of the semiconductor layer 215 is exposed by the ashed photoresist pattern 282.

Figure 11D:
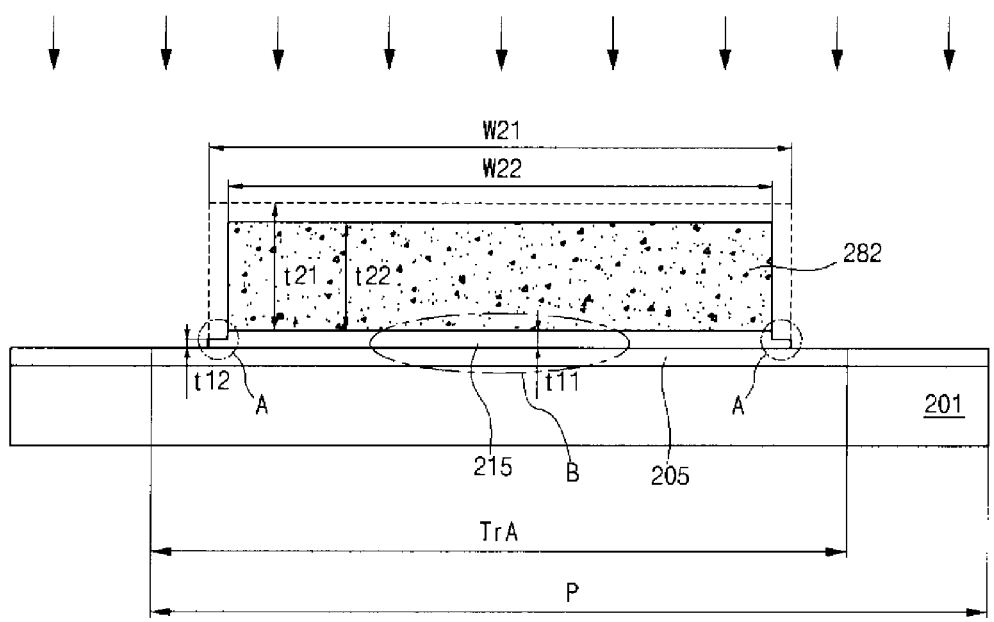

As illustrated in FIG. 11D, the semiconductor layer 215 is second-dry-etched using the ashed photoresist pattern 282 as an etching mask to partially remove the exposed edge portion A. When second-dry-etching the poly-crystalline layer 212, the oxygen ($O_2$) gas is replaced by a dry-etching gas including at least two of hydrogen bromide (HBr) gas, chlorine ($Cl_2$) gas, sulfur hexafluoride ($SF_6$) gas and bromine ($Br_2$) gas, as similar to the dry-etching gas for the first-dry-etching, in the chamber and a plasma treatment is performed. Accordingly, a step having a thickness t12 thinner than the thickness t11 of the semiconductor layer 215 below the ashed photoresist pattern 282 is formed substantially at the edge portion A. The second-dry-etching time may be less than the first-dry-etching time. The thickness t12 of the step may be about half of the thickness t11 by adjusting the second-dry-etching time. The second-dry-etching may have anisotropy to reduce a thickness of the edge portion A while not reducing a width of the edge portion A.

Figure 11E:
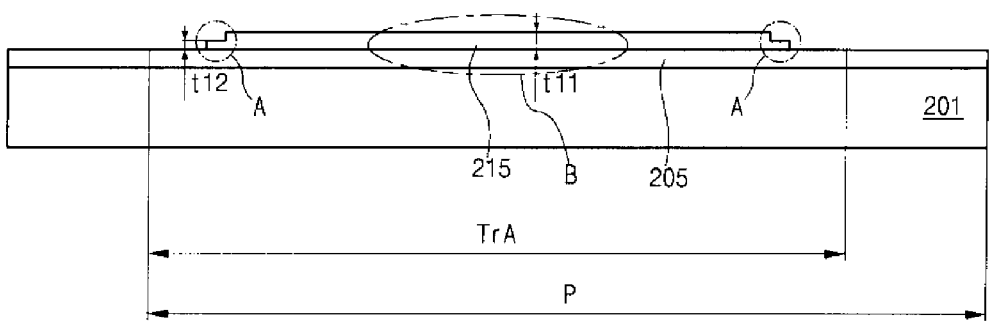

As illustrated in FIG. 11E, the ashed photoresist pattern (282 of FIG. 11D) is completely removed by an ashing process or a stripping process.

Through the above processes, the semiconductor layer 215 having two steps at the edge portion A according to the second embodiment is formed.

The semiconductor layer having three steps at the edge portion according to the third embodiment is formed by adding one more ashing process and one more dry-etching process after the second-dry-etching process. In a similar manner, the semiconductor layer having multiple steps at the edge portion can be formed.

Figure 12A:
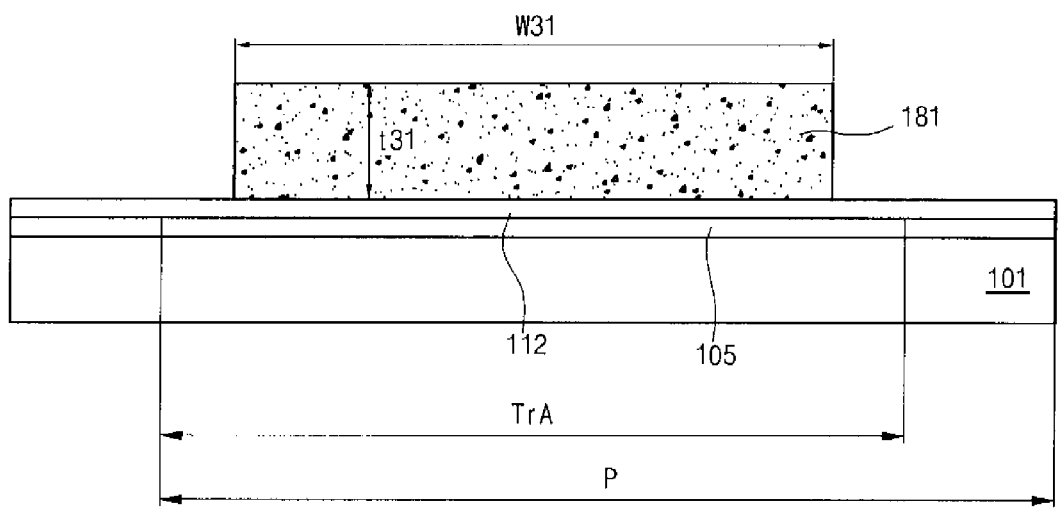
FIGS. 12A through and including 12D are cross-sectional views illustrating a method of forming the semiconductor layer having a taper-shaped side surface at the edge portion according to the first embodiment of the present invention.
Figure 12B:
Figure 12B:
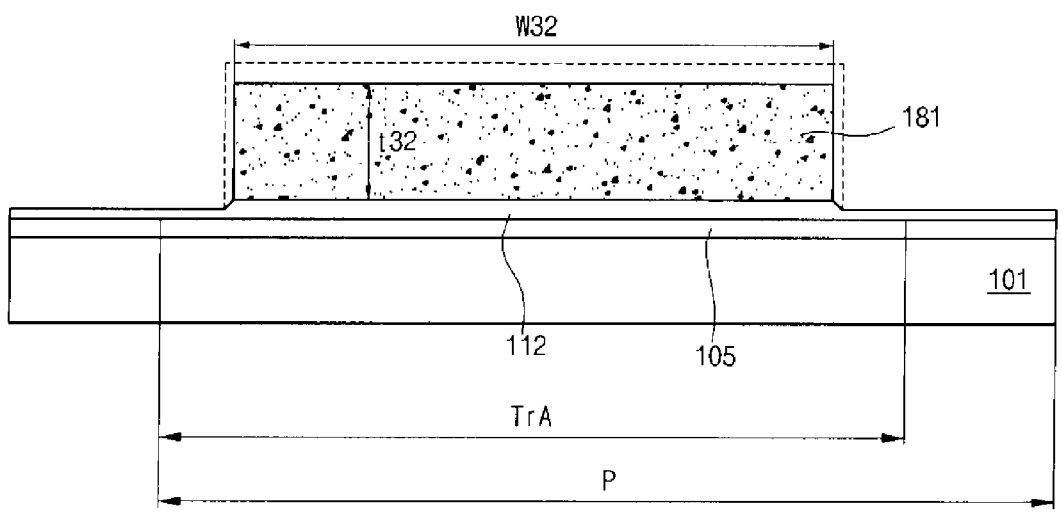
Figure 12C:
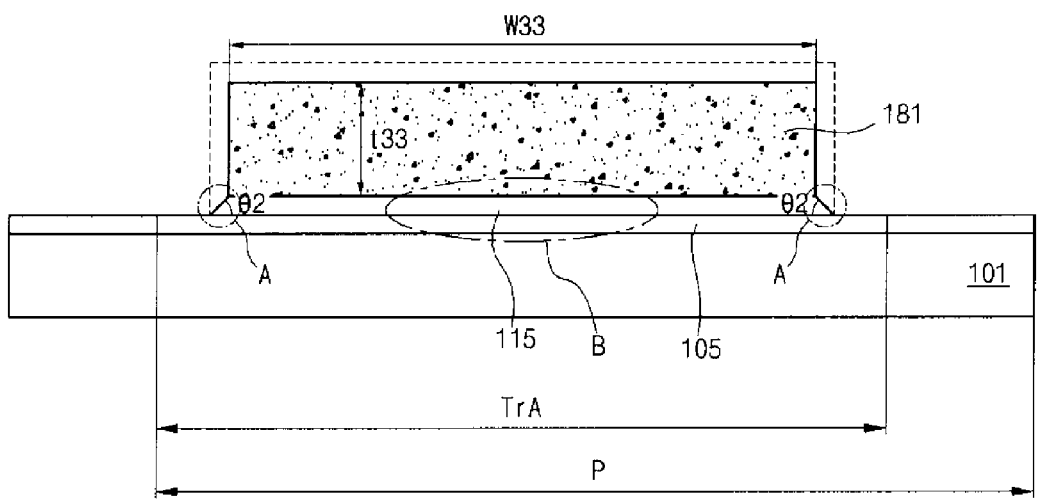
Figure 12D:
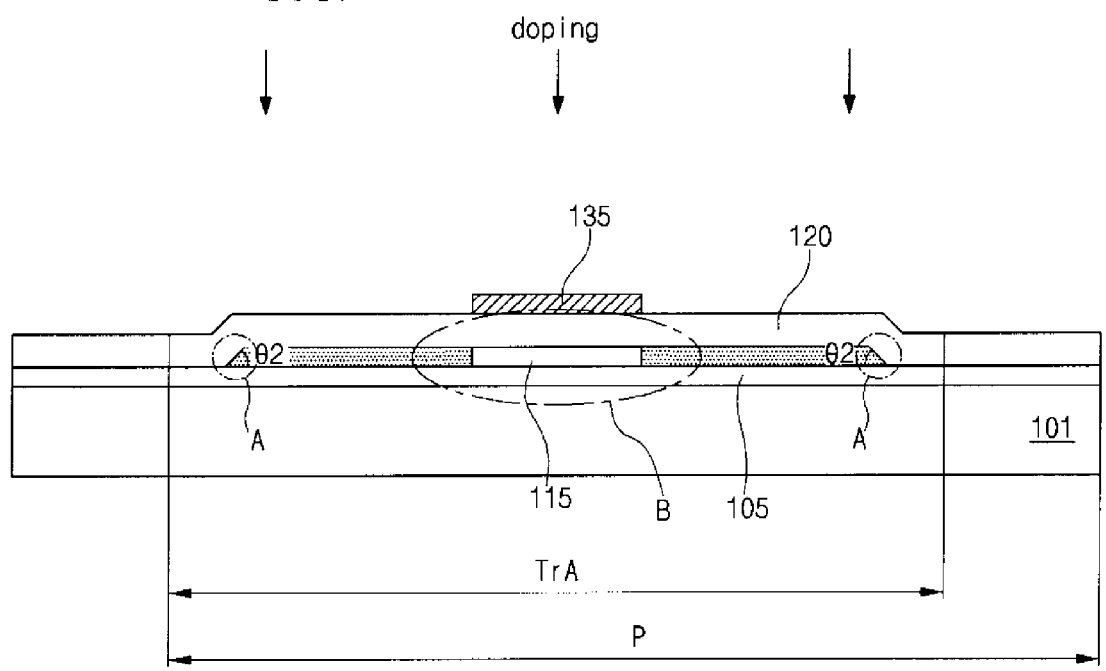

A method of forming the semiconductor layer having a taper-shaped side surface at the edge portion according to the first embodiment is explained with FIGS. 12A through 12C.

As illustrated in FIG. 12A, a photoresist pattern 181 is formed on a poly-crystalline silicon layer 112. The photoresist pattern 181 has a thickness t31 and a width w31.

As illustrated in FIGS. 12B and 12C, a dry-etching process and an ashing process are simultaneously performed. A dry-etching gas including at least two of hydrogen bromide (HBr) gas, chlorine ($Cl_2$) gas, sulfur hexafluoride ($SF_6$) gas and bromine ($Br_2$) gas, and oxygen ($O_2$) gas as the ashing gas are filled in a vacuum chamber and a plasma treatment is performed. Accordingly, the dry-etching for the poly-crystalline silicon layer 112 and the ashing process for the photoresist pattern 181 are simultaneously performed.

As time passes, the photoresist pattern 181 is continuously ashed and the thickness and width of the photoresist pattern become reduced (t31->t32->t33 and w31->w32->w33). At the same time, the poly-crystalline silicon layer 112 is continuously dry-etched using the photoresist pattern 181 being ashed as an etching mask. Accordingly, etching time for the poly-crystalline silicon layer 112 below from an outline of the photoresist pattern (181 of FIG. 12A) to an outline of the finally-ashed photoresist pattern (181 of FIG. 12C) is continuously reduced, and etching rate is also continuously reduced. When the dry-etching is completed, a semiconductor layer 115 including an edge portion A having a taper-shaped side surface of the angle θ2 of about 30 to about 60 degrees is formed. The angle θ2 of the side surface can be adjusted by adjusting oxygen ($O_2$) gas concentration.

Through the above processes in FIGS. 12A to 12C, the semiconductor layer 115 having a taper-shaped side surface at the edge portion A according to the first embodiment is formed.

Figure 11F:
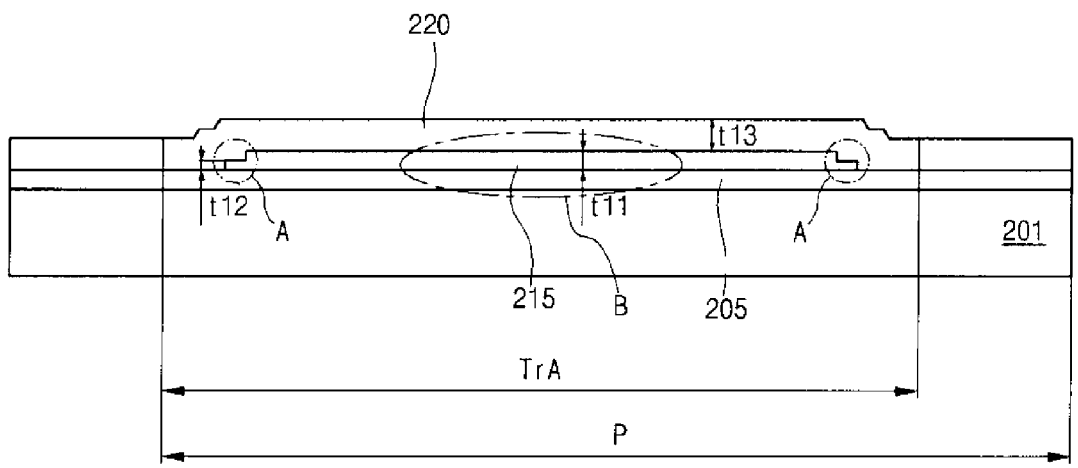

As illustrated in FIG. 11F, a gate insulating layer 220 is formed on the semiconductor layer 215 (or 115 of FIG. 12C) by depositing an inorganic material including silicon oxide ($SiO_2$) and silicon nitride (SiNx).

Since the gate insulating layer 220 may be formed by a deposition method, for example, a PECVD (plasma enhanced chemical vapor deposition) method, a step portion of the gate insulating layer 220 tends to have a thickness thinner than other portions. The thickness of the edge portion A of the semiconductor layer 215 (or 115 of FIG. 12C) is gradually reduced outwardly by having multi steps (or a taper shape). Accordingly, the gate insulating layer 220 has substantially the same thickness t13. The gate insulating layer 220 of the first embodiment may have a thickness within an error tolerance of about 10 to about 15 percent.

A metallic layer is deposited on the gate insulating layer 220. Since the gate insulating layer 220 has a substantially uniform thickness, the metallic layer also has a substantially uniform thickness, as illustrated in FIGS. 5 and 7. Further, since a metal has a step coverage better than an inorganic material, the metallic layer has substantially the same thickness.

Figure 11G:
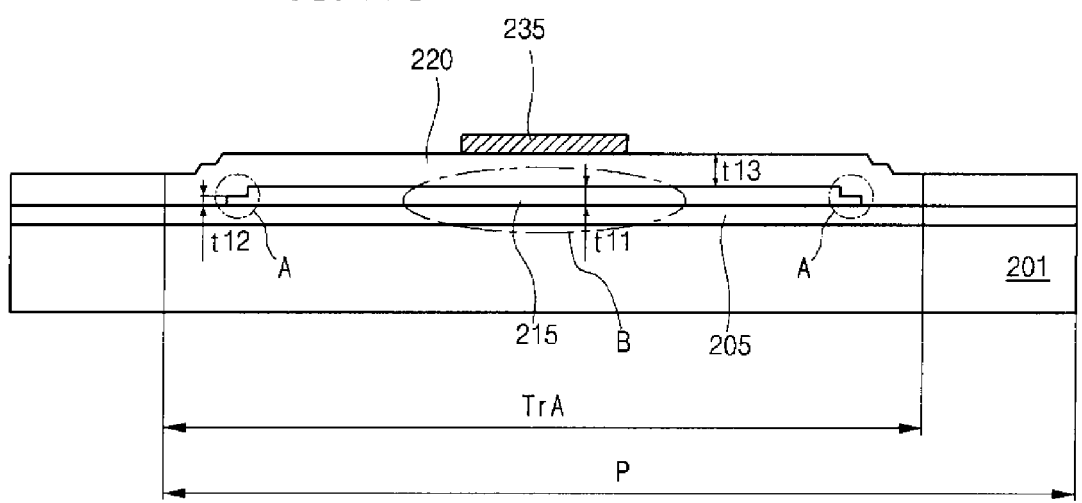

As illustrated in FIG. 11G, the metallic layer may be patterned with a mask process to form a gate line (not shown) and a gate electrode 235 protruding from the gate line.

Figure 11H:
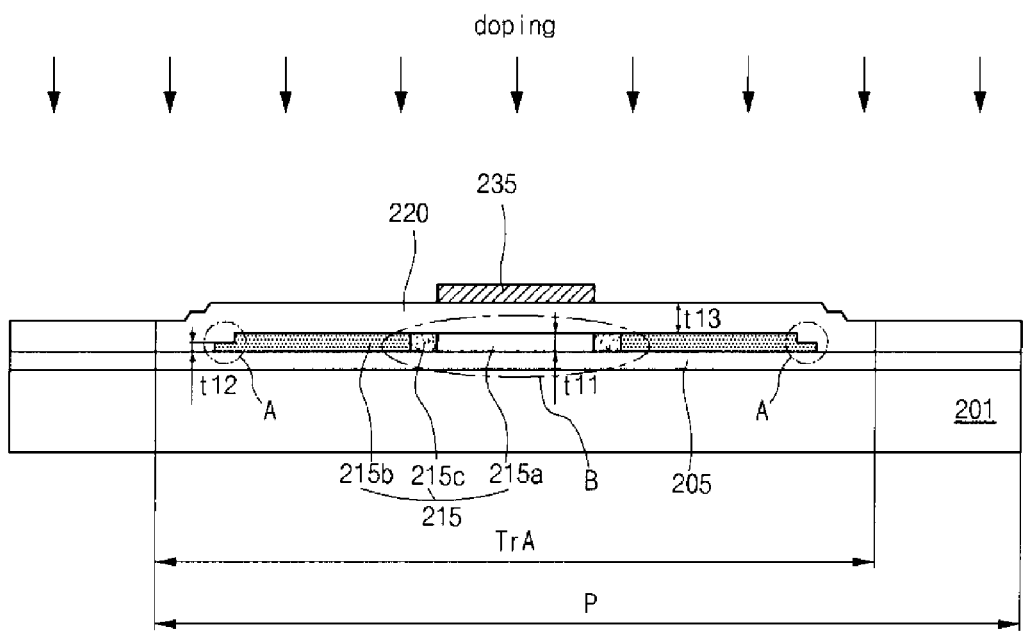

As illustrated in FIG. 11H, by using the gate electrode 235 as a doping mask, impurity such as n+ or p+ ions is doped in the semiconductor layer 215 to form ohmic contact portions 215b at both sides not covered by the gate electrode 235. A portion of the semiconductor layer 215 covered by the gate electrode 235 is defined as a channel portion 215a.

When n+-ions doping is performed, LDD portions 215c between the ohmic contact portions 215b and the channel portion 215a may be formed. The LDD portion 215c may have dosage lower than the ohmic contact portion 215b.

To form the LDD portion 215c, a gate pattern is formed using a photoresist pattern. The gate pattern has a width wider than the gate electrode 235. The n+-doping is performed using the gate pattern to form the n+-doped ohmic contact portion 215b. An ashing process is performed for the photoresist pattern on the gate pattern and side portions of the gate pattern are exposed by the ashed photoresist pattern. An etching is performed using the ashed photoresist pattern to remove the side portions of the gate pattern and form the gate electrode 235. A (n−)-doping with dosage lower than n+-ions is performed to form the LDD portions 215c between the ohmic contact portions 215b and the channel portion 215a.

Figure 11I:
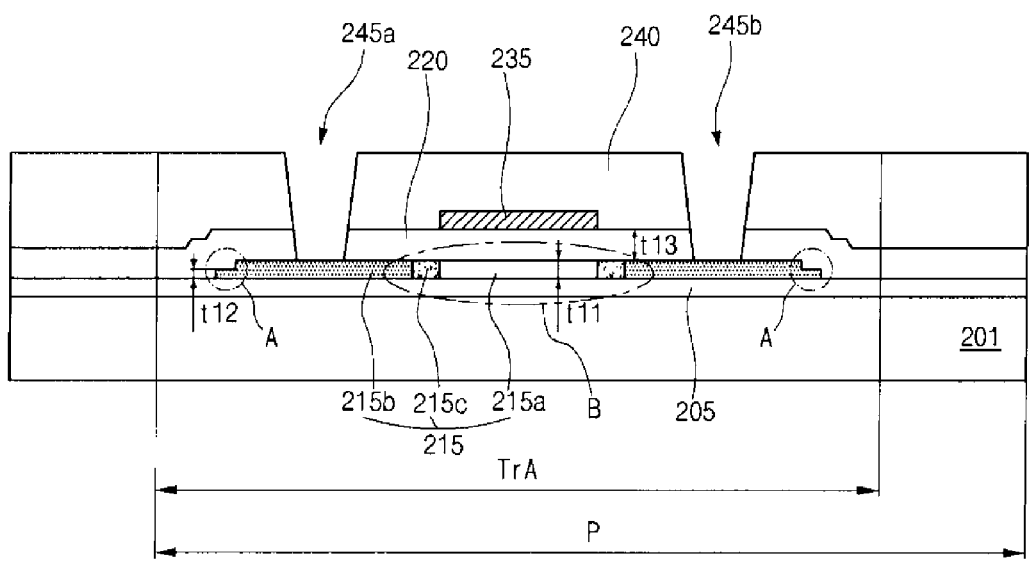

As illustrated in FIG. 11I, an interlayer insulating film 240 is formed on the substrate 201 having the gate electrode 235 by depositing an inorganic material including silicon oxide ($SiO_2$) and silicon nitride (SiNx) or coating an organic material including benzocyclobutene (BCB) and photo acrylic. The interlayer insulating film 240 and the gate insulating layer 220 are patterned to form semiconductor contact holes 245a and 245b exposing both ohmic contact portions 215b.

Figure 11J:
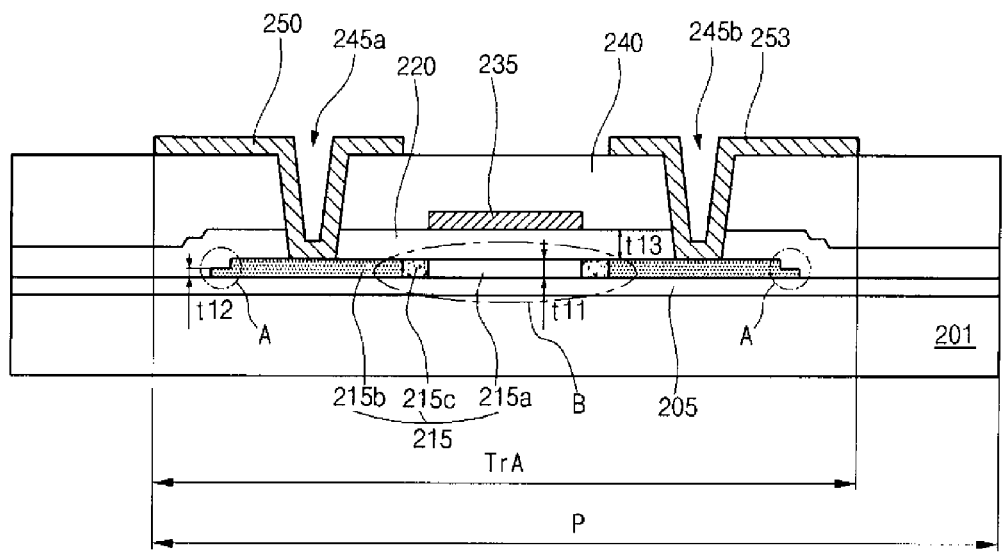

As illustrated in FIG. 11J, a metal is deposited on the interlayer insulating film 240 and patterned to form a data line (not shown), a source electrode 250 protruding from the data line, and a drain electrode 253 spaced apart from the source electrode 250. The data line crosses the gate line to define the pixel region P.

Figure 11K:
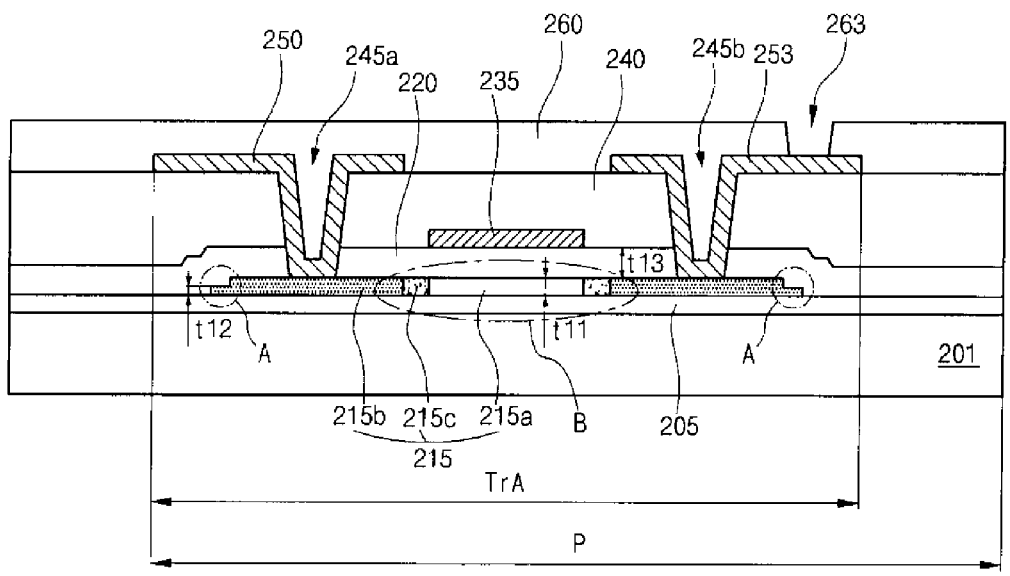

As illustrated in FIG. 11K, a passivation layer 260 is formed on the substrate 201 having the source and drain electrodes 250 and 253 by depositing an inorganic material including silicon oxide ($SiO_2$) and silicon nitride (SiNx) or coating organic material including benzocyclobutene (BCB) and photo acrylic. The passivation layer 260 is patterned to form a drain contact hole 263 exposing the drain electrode 253.

Figure 11L:
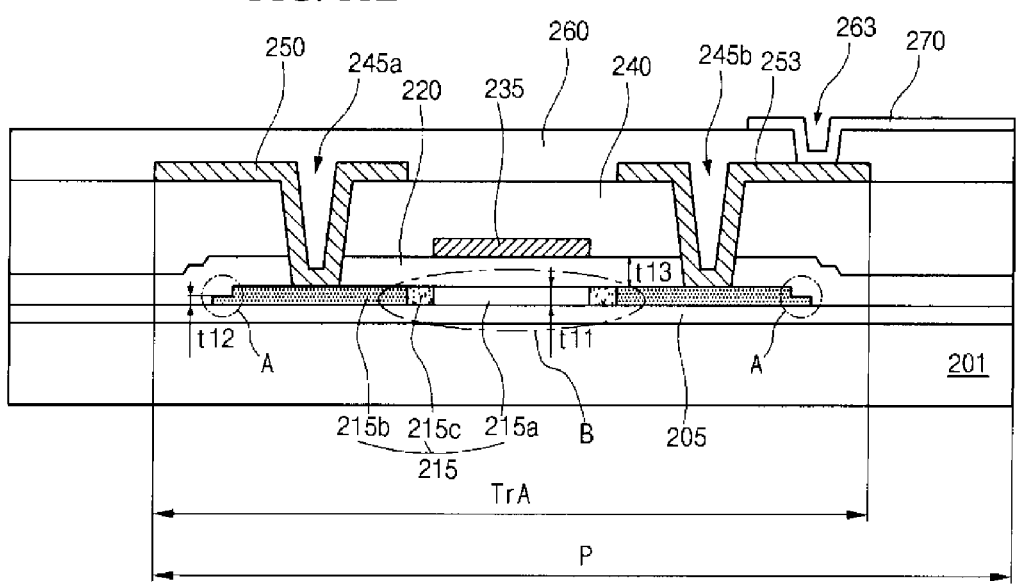

As illustrated in FIG. 11L, a transparent conductive material including indium-tin-oxide (ITO) and indium-zinc-oxide (IZO), for example, is deposited on the passivation layer 260 and patterned to form a pixel electrode 270 in the pixel region P. The pixel electrode 270 contacts the drain electrode 253 through the drain contact hole 263.

Through the above processes, the LCD devices according to embodiments of the present invention are fabricated.

In the embodiments of the present invention, due to the multi-step or substantially taper shape of the edge portion, the step portions of the gate insulating layer and the gate electrode near the edge portion have substantially the same thickness as other portions. A fringe effect may be reduced and a strong electric field induced due to fringe effect may also reduced at the edge portion. Accordingly, a side current along the width of the channel portion may be prevented. Further, although a strong electric field may be induced at the edge portion, since the edge portion has the thickness substantially less than other portions of the semiconductor layer, carriers such as electrons and holes may be reduced at the edge portion, and thus a side current may be prevented. Therefore, drain current flows normally with disruption caused by a side current reduced, and a hump may be prevented. Thus, reliability of the thin film transistor can be achieved.

It will be apparent to those skilled in the art that various modifications and variations can be made in the LCD device and the method of fabricating the same according to the present invention without departing form the spirit or scope of the invention. Thus, it is intended that the present invention cover the modifications and variations of this invention provided they come within the scope of the appended claims and their equivalents.

What is claimed is:

1. A method of fabricating a liquid crystal display device, comprising:
    forming a poly-crystalline silicon layer on a substrate;
    forming a photoresist pattern on the poly-crystalline silicon layer;
    simultaneously dry-etching the poly-crystalline silicon layer and ashing the photoresist pattern using hydrogen bromide gas, chlorine gas, sulfur hexafluoride gas, $Br_2$, and oxygen gas to form a semiconductor layer, wherein an edge portion of the semiconductor layer has a side surface of a substantially tapered shape;
    forming a gate insulating layer covering the semiconductor layer;
    forming a gate electrode on the gate insulating layer;
    forming a channel portion and ohmic contact portions in the semiconductor layer, the ohmic contact portions being disposed at both sides of the channel portion;
    forming source and drain electrodes contacting the semiconductor layer; and
    forming a pixel electrode contacting the drain electrode.

2. The method according to claim 1, wherein the side surface has an angle θ2 of about 30 to about 60 degrees with respect to a plane of the substrate.

3. The method according to claim 1, wherein forming the ohmic contact portions includes doping the semiconductor layer with n+ or p+-ions using the gate electrode as a doping mask after forming the side surface of the tapered shape.

4. The method according to claim 1, wherein the gate insulating layer has substantially a uniform thickness.

5. The method according to claim 1, wherein forming the semiconductor layer includes forming lightly doped drain portions substantially between the channel portion and the ohmic contact portions.

* * * * *